(12) United States Patent
Frodsham et al.

(10) Patent No.: US 6,262,585 B1
(45) Date of Patent: Jul. 17, 2001

(54) APPARATUS FOR I/O LEAKAGE SELF-TEST IN AN INTEGRATED CIRCUIT

(75) Inventors: R. Tim Frodsham; David J. O'Brien, both of Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/332,758

(22) Filed: Jun. 14, 1999

(51) Int. Cl.[7] .......................... G01R 31/02; H01H 31/02; H01J 19/82; G11C 7/02
(52) U.S. Cl. .................... 324/763; 324/760; 324/765; 324/537; 327/543; 365/229
(58) Field of Search .................. 324/763, 765, 324/537, 760; 365/229; 327/543

(56) References Cited

U.S. PATENT DOCUMENTS

| | | | |
|---|---|---|---|
| 4,775,959 | * 10/1988 | Sato et al. | 365/189 |
| 4,964,082 | * 10/1990 | Sato et al. | 365/189 |
| 5,670,890 | * 9/1997 | Colwell et al. | 324/765 |
| 5,757,203 | * 5/1998 | Brown | 324/765 |
| 5,834,967 | * 11/1998 | Kuroda et al. | 327/543 |
| 5,914,905 | * 6/1999 | Hikichi et al. | 365/229 |
| 5,929,650 | * 7/1999 | Pappert et al. | 324/763 |
| 5,953,190 | * 9/1999 | Rees et al. | 361/56 |
| 5,999,008 | * 12/1999 | Currin et al. | 324/765 |

\* cited by examiner

*Primary Examiner*—Safet Metjahic
*Assistant Examiner*—Wasseem H. Hamdan
(74) *Attorney, Agent, or Firm*—Blakely, Sokoloff, Taylor & Zafman LLP

(57) ABSTRACT

According to one embodiment, an integrated circuit is disclosed that includes a first input/output (I/O) circuit and a leakage detection circuit coupled to the first I/O circuit. In a test mode of operation, the leakage detection circuit tests the first I/O circuit for excessive leakage current. According to another embodiment, the integrated circuit also includes a first resistor coupled between a line voltage and the first I/O circuit and a second resistor coupled between the first I/O circuit and ground. Further, the integrated circuit includes a second I/O circuit coupled to the leakage detection circuit and the first and second resistors. The leakage circuit also tests the second I/O circuit for excessive leakage current in the test mode of operation.

23 Claims, 4 Drawing Sheets

US 6,262,585 B1

APPARATUS FOR I/O LEAKAGE SELF-TEST IN AN INTEGRATED CIRCUIT

FIELD OF THE INVENTION

The present invention relates to the field of integrated circuits; more particularly, the present invention relates to testing leakage current of an input/output buffer in an integrated circuit.

BACKGROUND

FIG. 1 illustrates a typical output driver included in an integrated circuit. The output driver includes a pre-driver, a PMOS transistor P coupled to a line voltage (Vcc) and an output pad. The output driver also includes an NMOS transistor N coupled to the output pad and ground. The output driver is typically used to boost the signal of data received from other components of an integrated circuit prior to transmission via the pad. However, the output driver must function properly in order to accurately transmit the data. Damaged or short-circuited devices are unreliable because a current path may exist from the output pad through to the circuit power supplies, although one or both of the transistors are deactivated. This condition in an output driver is commonly referred to as leakage current.

One method of determining whether an output driver is damaged or short-circuited is to conduct a leakage test. In order to conduct a leakage test, the P and N transistors are turned off, a voltage is forced to the output pad from an external source, and the resulting current is measured at the output pad. Once the transistors are turned off, the measured current should not exceed a predetermined threshold value. If the current exceeds the threshold value, the output driver is considered damaged.

One way to conduct a leakage test is to physically contact each output pad in an integrated circuit with a tester and assert a high voltage potential to determine if there is an excessive current path measured through the N transistor to ground. Alternatively, a low voltage potential may be applied to a pad to determine if an excessive current path measured from Vcc through the P transistor. The process of physically touching each output pad with a tester is cumbersome since an integrated circuit may contain numerous input/output buffers. Further, physically touching each output pad is costly due to the expensive equipment needed for accurate measurement. Therefore, an apparatus for self-testing for leakage current in an is input/output cell is desired.

SUMMARY OF THE INVENTION

According to one embodiment, an integrated circuit is disclosed that includes a first input/output (I/O) circuit and a leakage detection circuit coupled to the first I/O circuit. The leakage detection circuit tests the first I/O circuit for excessive leakage current.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A method and apparatus for performing an input/output (I/O) leakage self-test is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid the present invention.

Figure 1:
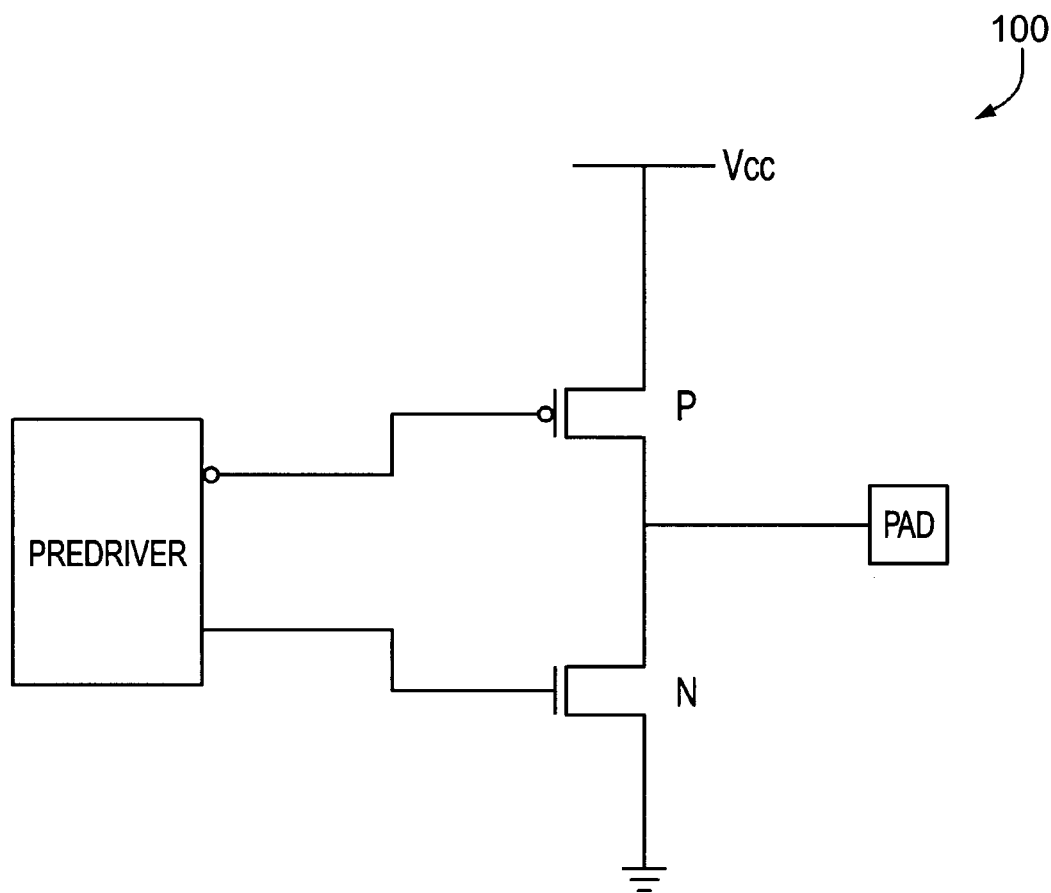
FIG. 1 is a block diagram of an exemplary output cell.
Figure 2:
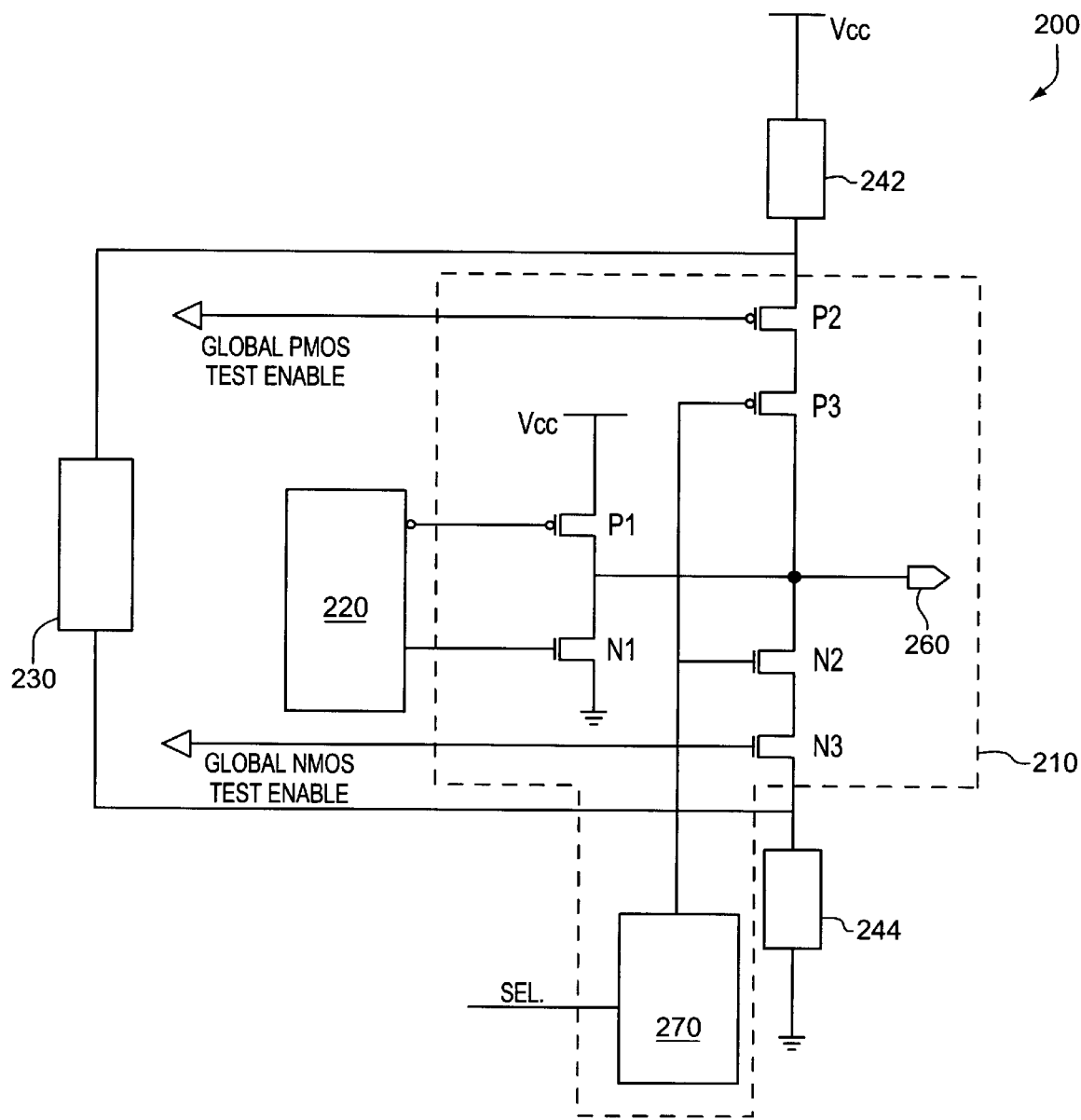
FIG. 2 is a block diagram of one embodiment of a circuit for implementing an I/O leakage self test.

FIG. 2 is a block diagram of one embodiment of circuit 200. Circuit 200 includes an input/output (I/O) cell 210, a preriver circuit 220, a leakage detector 230 and current source units 242 and 244. Current source units 242 and 244 are coupled to a line voltage ($V_{cc}$) and ground, respectively. The current source units 242 and 244 may be resistors that have high resistance values. High resistance values provide a test leakage current that is distributed to I/O cell 210 and leakage detector 230 whenever a leakage test is conducted at I/O cell 210. However, one of ordinary skill in the art will appreciate that any circuit that supplies current may be used as the current source units, such as current mirrors, precision current devices, etc.

Leakage detector 230 is coupled to current source units 242 and 244. According to one embodiment, leakage detector 230 includes a voltage detector, such as a differential amplifier, that measures the magnitude of leakage current through I/O cell 210 by measuring the voltage across current source unit 242 and current source unit 244. Additionally, leakage detector 230 includes a voltage comparison circuit that compares the voltage associated with the leakage current with a stored predetermined threshold voltage. Alternatively, current compare circuitry may be used to compare the leakage current with a predetermined reference current.

According to a further embodiment, leakage detector 230, and the current source units 242 and 244 are located on the same integrated circuit as I/O cell 210. However, in another embodiment, leakage detector 230 and the current source units 242 and 244 may be located on an integrated circuit separate from I/O cell 210. Further, the current source units 242 and 244 may be combined to form one current source unit that may be located internal or external to circuit 200.

Pre-driver 220 transmits data signals that are to be transmitted from computer circuit 200 via I/O cell 210. During normal operation, I/O cell 210 functions as an output driver that amplifies data signals received from pre-diver 220 before they are transmitted from circuit 200. I/O cell 210 includes an output pad 260, a selector circuit 270, PMOS transistors P1–P3 and NMOS transistors N1–N3. Transistors N1 and P1 encompass the output driver components of I/O cell 210. The gate of transistor P1 is coupled to predriver circuit 220, while its source and drain are coupled to $V_{cc}$ and output pad 260, respectively. The gate of transistor N1 is also coupled to pre-driver circuit 220. Additionally, the source and drain of transistor N1 are coupled to ground and output pad 260, respectively.

Transistors P2, P3, N2, and N3 are the test components of I/O cell 210. Transistors P2, P3, N2, and N3 are included to control the leakage current through transistors N1 and P1 during a leakage test. The gate of transistor P2 is coupled to a global PMOS test enable circuit (not shown). The source of transistor P2 is coupled to current source unit 242, while the drain is coupled to the source of transistor P3. The gate of transistor P3 is coupled to selector circuit 270 and the drain is coupled to output pad 260. The gate of transistor N2 is coupled to selector circuit 270. The drain of transistor N2 is coupled to output pad 260, while the source is coupled to the drain of transistor N3. The gate of transistor N3 is coupled to a global NMOS test enable circuit (not shown), and the source is coupled to current source unit 244.

In another embodiment, the position of transistors P2 and P3 may be switched such that the source of transistor P3 is coupled to current source unit 242, while its drain is coupled to the source of transistor P2. The drain of transistor P2 is coupled to output pad 260. Similarly, the position of transistors N2 and N3 may be switched such that the drain of transistor N3 is coupled to output pad 260, while its source is coupled to the drain of transistor N2. The source of transistor N2 is coupled to current source unit 244.

Selector circuit 270 generates local enable signals that activate transistors P3 and N2 in order to conduct a leakage test at I/O cell 210. The generation of local enable signals is triggered upon selector circuit 270 receiving a select signal. In one embodiment, the select signal is generated by a scan chain (not illustrated) and shifted to select circuit 270. Alternatively, the select signal may be generated at a global configuration register and routed to selector circuit 270. According to one embodiment, selector circuit 270 is a decoder. However, one of ordinary skill in the art will recognize that other devices may be used to implement selector circuit 270.

I/O cell 210 operates in a test mode and an output driver mode. If I/O cell 210 is operating in the test mode, the output driver components of I/O cell 210 (transistors N1 and P1) are shut off in order to determine the magnitude of leakage current through it. In addition, global test enable signals are received at transistors P2 and N3. Transistor P2 is activated upon receiving a low enable signal (a logical zero), and transistor N3 is activated by a high enable signal (a logical one). The activation of transistors P2 and N3 assists in enabling a leakage current path to transistors P1 and N1.

To test transistor N1, selector circuit 270 transmits a logical zero to transistors N2 and P3. Transistor P3 is activated and transistor N2 remains inactive. Consequently, a leakage current path is established from $V_{cc}$ through current source unit 242, transistors P2 and P3 and transistor N1 to ground. Leakage detector 230 measures the amount of leakage current that passes through transistor N1 to ground by monitoring the current across current source unit 242. Leakage detector 230 subsequently compares the magnitude of the measured current with the predetermined threshold current value. If the measured leakage current is below the predetermined threshold, the magnitude of the leakage is acceptable and N1 passes the leakage test. However, if the measured leakage current exceeds the predetermined threshold, N1 fails the leakage test.

To test transistor P1, selector circuit 270 transmits a logical one to transistors N2 and P3. Transistor N2 is activated and transistor P3 is deactivated. Consequently, a leakage current path is established from $V_{cc}$ through transistor P1, transistors N2 and N3, and current source unit 244 to ground. Leakage detector 230 measures the amount of leakage current that passes through-transistor P1 to ground by monitoring the current across current source unit 244. Thereafter, leakage detector 230 compares the magnitude of the measured current with the predetermined threshold current value. If the measured leakage current is below the predetermined threshold, the leakage current is acceptable and P1 passes the leakage test. However, if the measured leakage current exceeds the predetermined threshold, P1 fails the leakage test.

In addition to testing transistors N1 and P1, I/O cell 210 may test for leakage paths for other components within circuit 20 that are coupled to output pad 260. Such circuits may include input circuitry, package traces, capacitors, electrostatic discharge devices and Multi-Chip Module substrate routing. If any circuit fails the leakage test, I/O cell 210 is damaged or has a short circuit. Consequently, I/O cell 210 may suffer unreliable performance.

In the output driver mode of operation for I/O cell 210, transistors P2 and N3 remain inactive. Thus, the leakage current paths (e.g., $V_{cc}$ through transistor P2 to N1 and ground) are disabled. N1 and P1 operate as a typical output driver (e.g., receive and amplify data from predriver 220 and transmit the data out via pad 260).

Although I/O cell 210 has been described using three PMOS transistors and three NMOS transistors, one of ordinary skill in the art will appreciate that the present invention may be implemented using all NMOS transistors, all PMOS transistors, or any other desired combination. Additionally, one of ordinary skill in the art will recognize that other types of transistors may be used (e.g., bipolar) to implement the present invention to achieve the same results.

Figure 3:
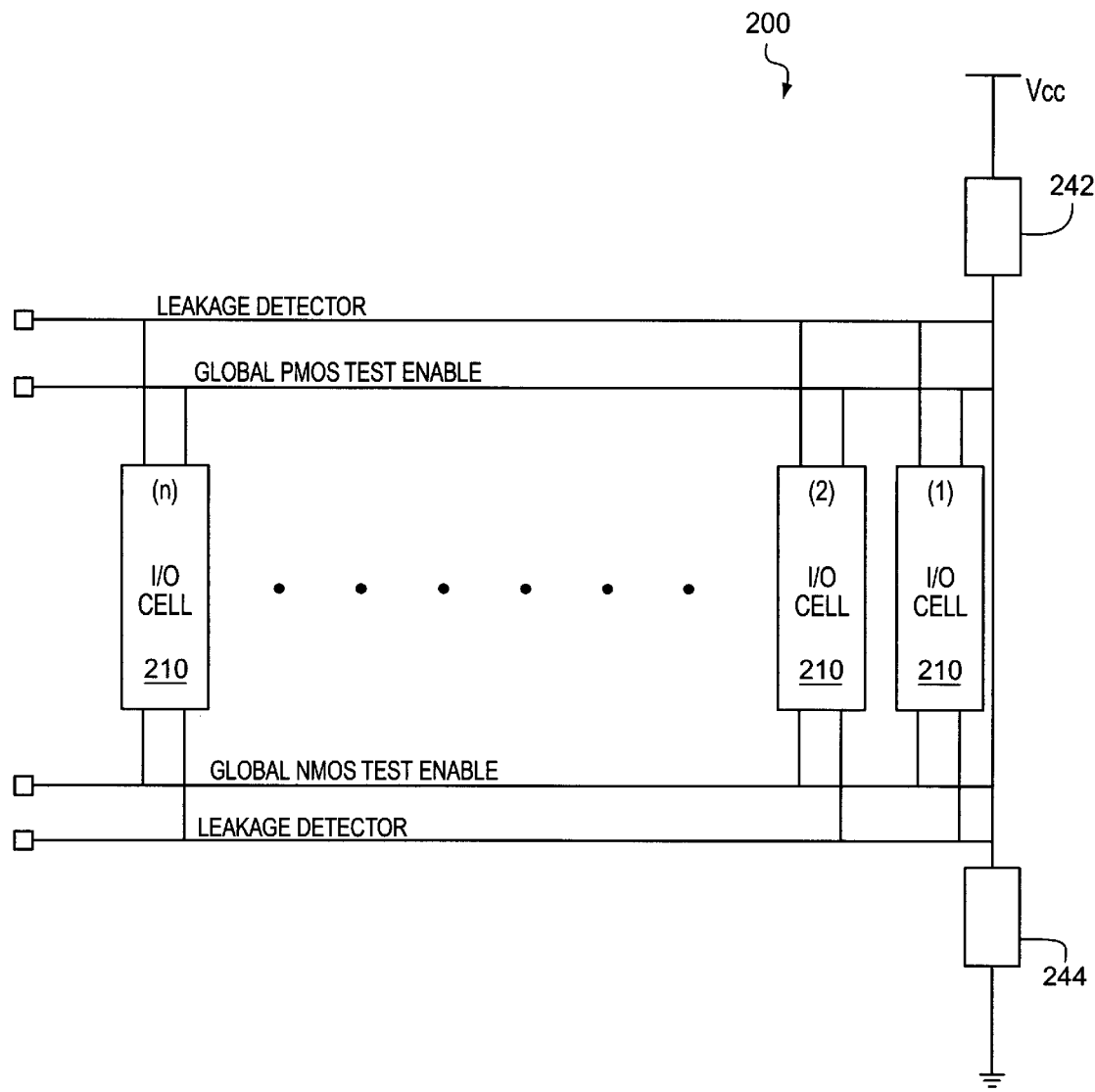
FIG. 3 is a block diagram of one embodiment of a circuit.

FIG. 3 is a block diagram of another embodiment of circuit 200 wherein circuit 200 includes a multitude of I/O cells 210. In such an embodiment, circuit 200 may include I/O cells 210(1)–210(n). Each of the I/O cells 210 are coupled to leakage detector 230 and the global test enable circuits (NMOS and PMOS). Additionally, each I/O cell 210 is coupled to current source unit 242 and current source unit 244. According to one embodiment, a leakage test of circuit 200 may be conducted by individually testing each I/O cell 210.

Upon initiating the leakage test, transistors P2 and N3 within each I/O cell are activated upon receiving the global test enables. Further, the selector circuits 270 sequentially receive select signals. Upon receiving the select signal, the selector circuit 270 within a particular I/O cell transmits enable signals to transistors P3 and N2 in order to execute the leakage test within the cell. For example, the selector circuit 270 within I/O cell 210(1) receives a select signal. Accordingly, selector circuit 270 activates transistors P3 and N2 thereby conducting the leakage test. Subsequently, the select signal is removed from I/O cell 210(1) and the selector circuit 270 within I/O cell 210(2) receives a select signal. Thereafter, transistors P3 and N2 within I/O cell 210(2) are activated. This process is repeated for each I/O cell 210 up to I/O cell 210(n). Accordingly, each I/O cell 210 within computer circuit 200 is tested for leakage current.

According to another embodiment, all, or a fraction, of the I/O cells 210 within computer circuit 200 may be tested in parallel using a speed mode of operation. In the speed mode, each I/O cell receives the global test enables, as described above. However, selector circuits 270 within each I/O cell are activated simultaneously. Subsequently, the sum of the leakage from the I/O cells may be compared to a predetermined threshold. The speed mode reduces test time and costs associated with testing computer circuit 200.

Figure 4:
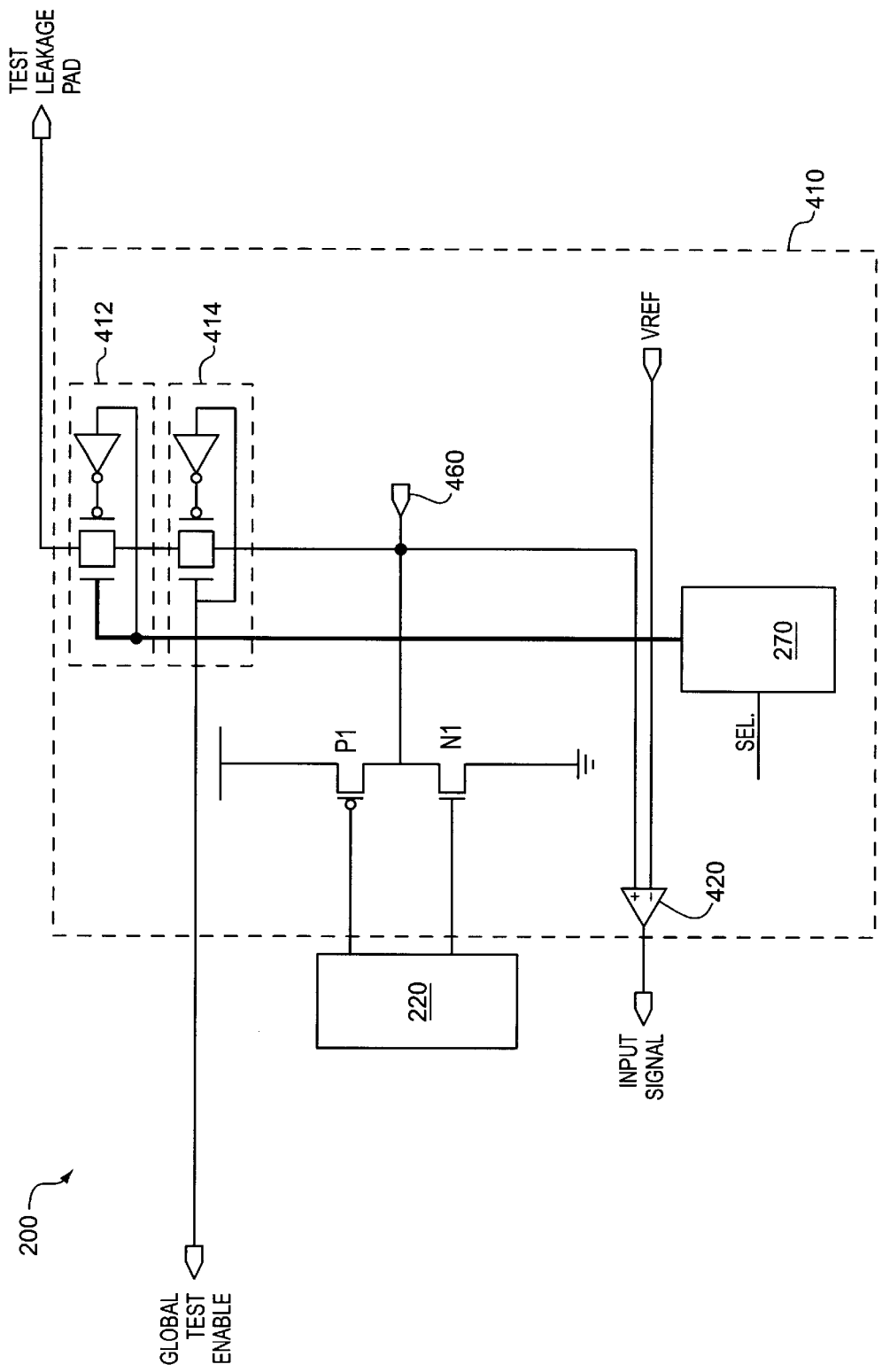
FIG. 4 is a block diagram of one embodiment of a circuit.

FIG. 4 is a block diagram of a her embodiment of circuit 200. In this embodiment, circuit 200 includes an input/output (I/O) cell 410 coupled to pre-driver circuit 220. In addition, I/O cell 410 is coupled to a tester leakage pad and a voltage reference pad ($V_{ref}$). As discussed above, pre-driver 220 transmits data signals that are to be transmitted from computer circuit 200 via I/O cell 410. The tester leakage pad is coupled to an integrated circuit tester (not shown) that provides a test current and/or voltage to I/O cell 410. The integrated circuit tester is also coupled to the $V_{ref}$ pad, which is used in normal circuit operation.

I/O cell 410 includes an I/O pad 460, selector circuit 270 and transistors P1 and N2 described above. In addition, I/O cell 410 includes a CMOS pass-gate 412 that is coupled to pass-gate 414. Pass-gate 414 is also coupled to I/O pad 460. Pass/gates 412 and 414 are the test components of I/O cell 410. Pass-gate 412 is coupled to selector circuit 270 and pass-gate 414 is coupled to a global test enable circuit (not shown). Selector circuit 270 generates local enable signals that activate pass-gate 412 in order to conduct a leakage test at I/O cell 410. The generation of local enable signals is triggered upon selector circuit 270 receiving the select signal.

To test transistors N1 and P1, selector circuit 270 transmits a logical one in order to activate both transistor gates of pass-gate 412. Additionally, both gates of pass-gate 414 are activated by a global test enable received from the global test enable circuit. In one embodiment, transistors N1 and P1 are tested by a parametric measurement unit within the integrated circuit tester. The integrated circuit tester provides a test current that flows through the pass-gates and through transistor N1 to ground. Subsequently, the integrated circuit tester switches the current path such that it flows from $V_{cc}$, through transistor P1 to ground.

If the measured leakage current through transistor N1 and transistor P1 is below a predetermined threshold, the leakage current is acceptable and I/O cell 410 passes the leakage test. However, if the measured leakage current exceeds the predetermined threshold, I/O cell 410 fails the leakage test.

As described above with respect to I/O cells 210, computer circuit 200 may also include a multitude of I/O cells 410 (e.g., cells 410(1)–410(n)) coupled to the test leakage pad and the global test enable circuit. A leakage test of computer circuit 200 may be conducted by individually testing each I/O cell 410. Upon initiating the leakage test, pass-gate 414 is activated by the global test enable circuit.

Additionally, the selector circuits 270 sequentially receive select signals. Upon receiving the select signal, the selector circuit 270 within a particular I/O cell transmits enable signals to pass-gate 412 in order to execute the leakage test within the cell. For example, the selector circuit 270 within a first I/O cell 410 receives a select signal. As a result, selector circuit 270 activates pass-gate 412 thereby conducting the leakage test.

Afterward, the select signal is removed from the first I/O cell 410 and transmitted to the selector circuit 270 within a second I/O cell 410. Thereafter, pass-gate 412 within the second I/O cell 410 is activated. This process is repeated for each I/O cell 410 within computer circuit 200. Consequently, each I/O cell 410 is tested for leakage current. Alternatively, all, or a fraction, of the I/O cells 410 within computer circuit 200 may be tested in parallel using the speed mode of operation described above.

Therefore, an apparatus for self testing an I/O circuit has been described.

What is claimed is:

1. An integrated circuit comprising:
   (1) a first input/output (I/O) circuit which comprises;
      (a) an output driver; wherein the output driver comprises;
         (I) a first transistor coupled to the I/O pad; and
         (ii) a second transistor coupled to the first transistor and the I/O pad;
      (b) an I/O pad coupled to the output driver; and
      (c) test circuitry coupled to the output driver,
   (2) a leakage detection circuit coupled to the first I/O circuit, wherein the leakage detection circuit measures the magnitude of leakage by the first I/O circuit and compares the magnitude of leakage to a predetermined threshold, wherein the leakage detection circuit comprises:
      (a) a voltage detection circuit for measuring the voltage drop across the first and second current sources; and
      (b) a voltage comparison circuit for comparing the measured voltage across the first and second current sources with a predetermined voltage threshold;
   (3) a first current source coupled between a line voltage and the first I/O circuit; and
   (4) a second current source coupled between the first I/O circuit and ground.

2. The integrated circuit of claim 1, further comprising:
   a second I/O circuit coupled to the leakage detection circuit and the first and second current sources, wherein the leakage detection circuit measures the magnitude of leakage by the first I/O circuit and compares the magnitude of leakage to a predetermined threshold.

3. The integrated circuit of claim 1, wherein the leakage detection circuit comprises:
   a current measurement circuit for measuring the current through the first and second current sources; and
   a current comparison circuit for comparing the measured current through the first and second current sources with a predetermined current threshold.

4. The integrated circuit of claim 1, wherein the test circuitry comprises:
   a third transistor coupled to the first current source;
   a fourth transistor coupled between the third transistor and the I/O pad;
   a fifth transistor coupled to the I/O pad; and
   a sixth transistor coupled between the fifth transistor and the second current source.

5. The integrated circuit of claim 4, wherein the I/O circuit further comprises a selector circuit coupled to the fourth and fifth transistors, wherein the selector circuit activates the fourth and fifth transistors whenever the leakage detection circuit tests the first I/O circuit.

6. The integrated circuit of claim 5, wherein a leakage current flows through the second transistor of the output driver whenever the output driver is deactivated and the third and fourth transistors are activated.

7. The integrated circuit of claim 6, wherein a leakage current flows through the first transistor of the output driver whenever the output driver is deactivated and the fifth and sixth transistors are activated.

8. The integrated circuit of claim 7, wherein the output driver is damaged if the leakage currents through the first or second transistors is greater than a predetermined threshold value.

9. The integrated circuit of claim 1, wherein the first and second current sources are resistors.

10. The integrated circuit of claim 1 further comprising a test current source coupled to the first I/O circuit.

11. The integrated circuit of claim 10, further comprising a second I/O circuit coupled to the leakage detection circuit and the test current source, wherein the leakage detection circuit tests the second I/O circuit for excessive leakage current.

12. The integrated circuit of claim 10, wherein the I/O circuit comprises;
   an output driver;
   an I/O pad coupled to the output driver; and
   test circuitry coupled to the output driver.

13. The integrated circuit of claim 12, wherein the test circuitry comprises:
   a first pass-gate coupled to the test current source; and
   a second pass-gate coupled between the first pass-gate and the I/O pad.

14. The integrated circuit of claim 13, wherein the I/O circuit further comprises a selector circuit coupled to the first pass-gate, wherein the selector circuit activates the first pass-gate whenever the leakage detection circuit tests the first I/O circuit.

15. The integrated circuit of claim 14, wherein the second pass-gate is activated whenever the leakage detection circuit tests the first I/O circuit.

16. The integrated circuit of claim 15, wherein a leakage current flows through the first or second transistors of the output driver whenever the output driver is deactivated and the first and second pass-gates are activated.

17. The integrated circuit of claim 12, wherein the I/O circuit further comprises:
   an input structure coupled to the I/O pad;
   voltage test circuitry coupled to the I/O pad; and
   a voltage reference pad coupled to the input structure.

18. In an integrated circuit having leakage detection circuitry and a plurality of input/output (I/O) circuits, wherein each of the plurality of I/O circuits include an output driver and a leakage test circuit, a method of measuring leakage current comprising:
   providing a first leakage current path at the leakage test circuit of a first I/O circuit,
      wherein the first leakage current path flows through the output driver of the first I/O circuit;
   measuring the magnitude of the first leakage current path at the leakage detection circuitry; and
   comparing the magnitude of the first leakage current path to a predetermined threshold value stored at the leakage detection circuitry
   providing a second leakage current path at the leakage test circuit of the first I/O circuit,
   wherein the second leakage current path flows through the output driver of the first I/O circuit;
   measuring the magnitude of the second leakage current path at the leakage detection circuitry; and
   comparing the magnitude of the second leakage current path to the predetermined threshold value stored at the leakage detection circuitry;
   providing the first and second leakage current paths at the leakage test circuit further comprises:
      enabling a first set of transistors upon receiving an enable signal from a selector circuit within the I/O circuit; and
      enabling a second set of transistors upon receiving an enable from a global leakage enable circuit.

19. The method of claim 18, further comprising deactivating the output driver prior to providing the first and second leakage paths.

20. The method of claim 18, wherein the output driver is damaged if the magnitude of the first or second leakage current paths is greater than the predetermined threshold value.

21. The method of claim 18, further comprising:
   removing the first and second leakage current paths from the output driver within the first I/O circuit;
   providing a third leakage current path at the leakage test circuit of a second I/O circuit, wherein the third leakage path flows through the output driver of the second I/O circuit;
   measuring the magnitude of the third leakage current path at the leakage detection circuitry; and
   comparing the magnitude of the third leakage current path to the predetermined threshold value stored at the leakage detection circuitry.

22. The method of claim 21, further comprising:
   providing a fourth leakage current path at the leakage test circuit of the second I/O circuit, wherein the fourth leakage path flows through the output driver of the second I/O circuit;
   measuring the magnitude of the fourth leakage current path at the leakage detection circuitry; and
   comparing the magnitude of the fourth leakage current path to the predetermined threshold value stored at the leakage detection circuitry.

23. The method of claim 18, further comprising:
   providing a third leakage current path at the leakage test circuit of a second I/O circuit, wherein the third leakage path flows through the output driver of the second I/O circuit;
   providing a fourth leakage current path at the leakage test circuit of the second I/O circuit, wherein the fourth leakage path flows through the output driver of the second I/O circuit;
   measuring the magnitude of the first, second, third and fourth leakage current paths at the leakage detection circuitry; and
   comparing the magnitude of the first, second, third and fourth leakage current paths to the predetermined threshold value stored at the leakage detection circuitry.

* * * * *

UNITED STATES PATENT AND TRADEMARK OFFICE
CERTIFICATE OF CORRECTION

PATENT NO.    : 6,262,585 B1
DATED         : July 17, 2001
INVENTOR(S)   : Frodsham et al.

It is certified that error appears in the above-identified patent and that said Letters Patent is hereby corrected as shown below:

<u>Column 2,</u>
Line 18, delete "preriver", insert -- pre-driver --.

<u>Column 4,</u>
Line 64, delete "her", insert -- further --.

Signed and Sealed this

Fourth Day of June, 2002

Attest:

Attesting Officer

JAMES E. ROGAN
*Director of the United States Patent and Trademark Office*